US008952328B2

(12) United States Patent
Sluijterman et al.

(10) Patent No.: US 8,952,328 B2
(45) Date of Patent: Feb. 10, 2015

(54) CHARGED PARTICLE DETECTOR SYSTEM COMPRISING A CONVERSION ELECTRODE

(75) Inventors: Albertus Aemillius Seyno Sluijterman, Eindhoven (NL); Eric Gerardus Theodoor Bosch, Eindhoven (NL); Patrick David Vogelsang, Eindhoven (NL); Johannes Adrianus Carolus Cooijmans, Den Dungen (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 13/566,828

(22) Filed: Aug. 3, 2012

(65) Prior Publication Data
US 2013/0056634 A1   Mar. 7, 2013

Related U.S. Application Data

(60) Provisional application No. 61/514,632, filed on Aug. 3, 2011.

(30) Foreign Application Priority Data

Aug. 3, 2011 (EP) .................................. 11176401

(51) Int. Cl.
*H01J 37/244* (2006.01)
*H01J 37/28* (2006.01)

(52) U.S. Cl.
CPC ............. *H01J 37/244* (2013.01); *H01J 37/28* (2013.01); *H01J 2237/24495* (2013.01); *H01J 2237/2441* (2013.01); *H01J 2237/2443* (2013.01); *H01J 2237/24445* (2013.01); *H01J 2237/24475* (2013.01); *H01J 2237/2448* (2013.01); *H01J 2237/24585* (2013.01); *H01J 2237/2802* (2013.01); *H01J 2237/31749* (2013.01)
USPC ............ 250/306; 250/307; 250/310; 250/397

(58) Field of Classification Search
None
See application file for complete search history.

(56) References Cited

U.S. PATENT DOCUMENTS

| 5,006,795 | A | * | 4/1991 | Yoshizawa et al. | ...... 324/754.22 |
| 5,578,822 | A | | 11/1996 | Van Der Mast et al. | |
| 5,939,720 | A | * | 8/1999 | Todokoro | ...... 250/310 |
| 5,945,672 | A | * | 8/1999 | Knowles et al. | ...... 250/310 |
| 6,501,077 | B1 | * | 12/2002 | Sawahata et al. | ...... 250/310 |

(Continued)

OTHER PUBLICATIONS

Extended European Search Report dated Dec. 20, 2011 for Application No. 11176401.5.

*Primary Examiner* — Jack Berman
*Assistant Examiner* — James Choi
(74) *Attorney, Agent, or Firm* — Scheinberg & Associates, PC; Michael O. Scheinberg

(57) ABSTRACT

The invention relates to a charged particle detector system comprising a conversion plate (110) to convert incoming radiation to secondary electrons. These secondary electrons are then detected by a secondary electron detector (120), thereby providing information of the incoming radiation. Often this information is limited to, in first approximation, the flux of incoming radiation. In the case of, for example, backscattered electrons this is the current of the incoming backscattered electrons. The invention proposes to form the conversion plate as, for example, an energy dependent detector, for example a photodiode to detect electrons, so that the detector system simultaneously provides information of, for example, current ($S_1$) and mean energy ($S_2$) of the incoming radiation. The detector system is especially suited for use in a SEM or a DualBeam apparatus.

23 Claims, 2 Drawing Sheets

(56) References Cited

U.S. PATENT DOCUMENTS

| | | |
|---|---|---|
| 7,009,187 B2 | 3/2006 | Gerlach et al. |
| 2002/0079462 A1* | 6/2002 | Amemiya et al. .......... 250/491.1 |
| 2003/0127604 A1* | 7/2003 | Todokoro et al. ............. 250/436 |
| 2005/0173644 A1* | 8/2005 | Gnauck et al. ........... 250/370.11 |
| 2006/0169899 A1* | 8/2006 | Parker et al. .................. 250/310 |
| 2008/0035843 A1* | 2/2008 | Hatano et al. ................. 250/288 |
| 2009/0050803 A1* | 2/2009 | Tanba et al. ................... 250/310 |

\* cited by examiner

CHARGED PARTICLE DETECTOR SYSTEM COMPRISING A CONVERSION ELECTRODE

This application claims priority from U.S. Provisional Application 61/514,632, filed Aug. 3, 2011, which is hereby incorporated by reference.

The invention relates to a charged particle detector system for a charged particle apparatus, the system comprising:

A conversion plate generating one or more secondary electrons when exposed to radiation, and A secondary electron detector for detecting said secondary electrons.

In a Scanning Electron Microscope (SEM) a sample is irradiated by a focused electron beam, the electrons typically having an energy of between 100 eV and 30 keV. Secondary radiation emerges from the sample in response to said irradiation, including secondary electrons (SE's) having an energy below 50 eV and backscattered electrons (BSE's) having an energy above 50 eV (up to the energy of the impinging electrons). These SE's and BSE's are detected by an electron detector, such as a scintillator based detectors (e.g. the Everhart-Thornley detector), a semiconductor detectors (e.g. photodiodes, avalanche photodiodes, Geiger mode avalanche photodiodes, multi-pixel photon counters, CCD and CMOS chips), or the like.

In a Focused Ion Beam apparatus (FIB) a sample is irradiated by a focused ion beam, the ions typically having an energy of between 100 eV and 30 keV. Secondary radiation emerges from the sample in response to said irradiation, including SE's and secondary ions (SI's) sputtered from the surface. These SE's and SI's are detected by charged particle detectors. To detect the SI's often a conversion plate is used, the impinging ions causing electrons to be ejected from the conversion plate to be detected by a secondary electron detector.

European Patent No. EP1636819 describes a detector for use in a Dual Beam Apparatus. In a Dual Beam Apparatus the apparatus is equipped with a SEM column and a FIB column, and by using a detector equipped with a conversion plate one detector can be used to selectively detect SI's or SE's, by switching the polarity of the voltage of the conversion plate. The secondary electrons emanating from the conversion plate are often referred to as type 3 secondary electrons (SE3's). These SE3's can then be directed to an electron detector, such as previously mentioned scintillator based detector (e.g. the Everhart-Thornley detector), semiconductor detector (e.g. photodiode, avalanche photodiode, Geiger mode avalanche photodiode, multi-pixel photon counter, CCD and CMOS chip), or the like.

An advantage of a detector using a conversion plate is that in a simple, and thus cheap, manner a large opening angle can be detected. Another advantage is that, by properly choosing the polarity of the conversion plate with respect to the sample, either electrons or ions can be detected.

A disadvantage of the detector system described in the known patent that its information is, in first approximation, limited to the amount of radiation (for charged particles: the current) times the SE yield for the impinging radiation.

The invention intends to provide a detector giving more information of the impinging radiation.

To that end the detector system according to the invention is characterized in that the conversion plate is a radiation detector providing information of the radiation, as a result of which both the information of the conversion plate and the information of the secondary electron detector are provided simultaneously.

The invention is based on the insight that the conversion plate not only can be used to generate secondary electrons, but can be formed as, for example, an energy dependent detector (that is: a detector providing information of the energy of the impinging radiation, such as, for example, charged particles or X-ray photons). This is explained as follows:

As is known from, for example, "A new examination of secondary electron yield data", Y. Lin et al., Surf. Interface Anal. 2005; 37: 895-900, further referred to as Lin [1], the secondary electron yield of materials varies with the energy of the impinging particles (electrons), showing a maximum for an energy of 150 eV to 700 eV (depending on the material). For higher energies of, for example, between 10 keV and 30 keV the yield varies only moderately, with a lower yield for higher energies. Contrary to this energy dependent detectors, such as a semiconductor detector, typically show a monotonously increasing response from a lower detection limit (typically 500 eV or less) to over 100 keV. As the energy dependency of the two signals shows a different dependency on the energy, a detector can be built giving, for example, information of the number of the impinging particles (the current) and the (mean) energy of the impinging particles. In this way, for example, not only the amount of radiation (the current) can be determined, but also the ratio of SE's and BSE's coming from the sample.

When using the detector to detect photons, in a similar way the number of photons and the (mean) energy of the photons can be detected.

In a preferred embodiment of the detector according to the invention the conversion plate is a semiconductor detector, e.g. a photo-diode, where an impinging particle generates a number of electron-hole pairs in a sensitive volume.

The use of such a photo-diode for detecting electrons is known from, for example, "Versatile silicon photodiode detector technology for scanning electron microscopy with high-efficiency sub-5 keV electron detection". A.Šakić et al., Technical Digest International Electron Devices Meeting IEDM (2010), Pages: 31.4.1-31.4.4, further referred to as Šakić [2].

When an electron hits such a diode a number of electron/hole pairs is generated. The number of electron-hole pairs depends on the energy of the impinging electron. The impinging electron first traverses a layer where generated electron/hole pairs recombine and do not contribute to an output signal, the so-named dead layer. Further removed from the surface the electron then enters an active layer where it loses its remaining energy. Each electron-hole pair represents an energy loss of several eV (for silicon: 3.6 eV). By collecting the electrons to an anode and the holes to a cathode a signal is formed.

In another embodiment of the detector according to the invention the conversion plate is a scintillator, the scintillator coupled to a photon detector Also in scintillator based detectors, such as the Everhart-Thornley detector, the number of photons produced in the scintillator per incident particle is proportional to the energy of that particle. However, the number of secondary electrons is proportional to the number of incoming particles. This makes it possible to determine both the (mean) energy and the number of particles (the impinging current).

In yet another embodiment of the detector system according to the invention the conversion plate can be biased with respect to the sample position, the biasing selected such that the detector detects only positively charged particles, only negatively charged particles negatively charged particles with an energy above a selected threshold value and positively charged particles, or positively charged particles with an energy above a selected threshold value and negatively charged particles.

By selecting an appropriate bias voltage negatively charged particles can be decelerated while positively charged particles are accelerated to the conversion plate. This can result that all, or only highly energetic negatively charged particles, together with the positively charged particles, impact on the conversion plate, while low energetic negatively charged particles are deflected away (retarded) from the conversion plate.

Likewise a bias voltage with the other polarity results in that all, or only highly energetic positively charged particles, together with the negatively charged particles, impact on the conversion plate, the other particles deflected away (retarded) from the conversion plate.

In yet another embodiment of the detector system according to the invention the conversion plate is coated with a layer comprising platinum, hafnium, tantalum, gold, or chromium, the layer having a thickness of between 5-25 nm, more specifically between 10 and 20 nm.

As known from Lin [1], the secondary electron yield (SE yield) for different materials varies drastically. As shown in its Table 1, platinum shows for energies between 2 keV and 20 keV the highest SE yield, followed by hafnium, tantalum and gold. For lower energies (2 keV) also the use of chromium may be contemplated. For producing a large SE3 signal one of these materials should be used as a surface layer.

It is noted that for practical reasons mercury (Hg) is not selected.

When using, for example, a photodiode, the layer must be sufficiently thin for impinging particles to reach the active layer, but sufficiently thick to resemble the bulk properties of the material. It is noted that silicon and/or germanium, materials of which a photodiode is made, are not materials showing high SE yield at energies of, for example, between 2 keV and 20 keV. It is further noted that, although the penetration of, for example, 20 keV electrons in a material amount to approximately 1 μm, SE's only escape from the uppermost layer.

In an aspect of the invention a charged particle apparatus is equipped with a detector system according to the invention, the charged particle apparatus equipped with a scanning electron microscope column, a scanning transmission electron microscope column, and/or a focused ion beam column.

In an embodiment of the charged particle apparatus according to the invention the charged particle apparatus shows a charged particle source and an objective lens with an optical axis, and the conversion plate is positioned between the objective lens and the charged particle source.

In this embodiment the detector is positioned between the objective lens and the charged particle source of a column, and is thus referred to as an in-column detector. Such in-column detectors are used in high-resolution SEM columns, as the lens aberrations, and thus the resolution of the focused electron beam, are a function of the lens focal length. It is thus beneficial to position the sample as close to the lens as possible. Here the SE's and BSE's travel from the sample through the lens to the conversion plate.

In another embodiment of the charged particle apparatus according to the invention the charged particle apparatus shows a sample position and an objective lens with an optical axis, and the conversion plate is positioned between the objective lens and the sample position.

In this embodiment the detector is positioned between the objective lens and the sample position, and is thus referred to as a post-column detector.

In yet another embodiment of the charged particle apparatus according to the invention the charged particle apparatus is an environmental scanning electron microscope equipped to operate to work with a pressure at the sample position of between $10^{-2}$ mbar to 50 mbar, more specifically 1 to 10 mbar, said pressure resulting in a gaseous environment between the conversion plate and the detector for detecting said secondary electrons, and the conversion plate is equipped to be biased with respect to the detector for detecting said secondary electrons such that electron multiplication occurs in the gaseous environment.

In this embodiment the detector is used as a gaseous backscattered electron detector as described in, for example, U.S. Pat. No. 5,945,672.

In a further embodiment of the charged particle apparatus according to the invention the conversion plate is aligned round the optical axis.

Preferably the conversion plate is a plate with a central through-hole, through which hole the beam of charged particles is directed towards the sample.

BRIEF DESCRIPTION OF THE DRAWINGS

The invention is now elucidated using figures, in which identical reference numerals refer to corresponding features. To that end:

FIG. 1 shows an objective lens 102 with an optical axis 100. The objective lens focuses a beam of charged particles 104 on a sample 106 at a sample position 108. A conversion plate in the form of a radiation detector 110 surrounds the axis 100, and is placed between the objective lens 102 and the sample 106. Secondary electrons of type SE3 emitted by the conversion plate/radiation detector in response to radiation impinging on the conversion plate are guided to the secondary electron detector (SED) 112. SED 112, which may be as simple as e.g. a simple wire loop or a flat electrode, positioned round the axis 100, is biased with a positive voltage with respect to the conversion plate 110, so that SE3 emerging from the conversion plate are guided to the SED.

Figure 1:
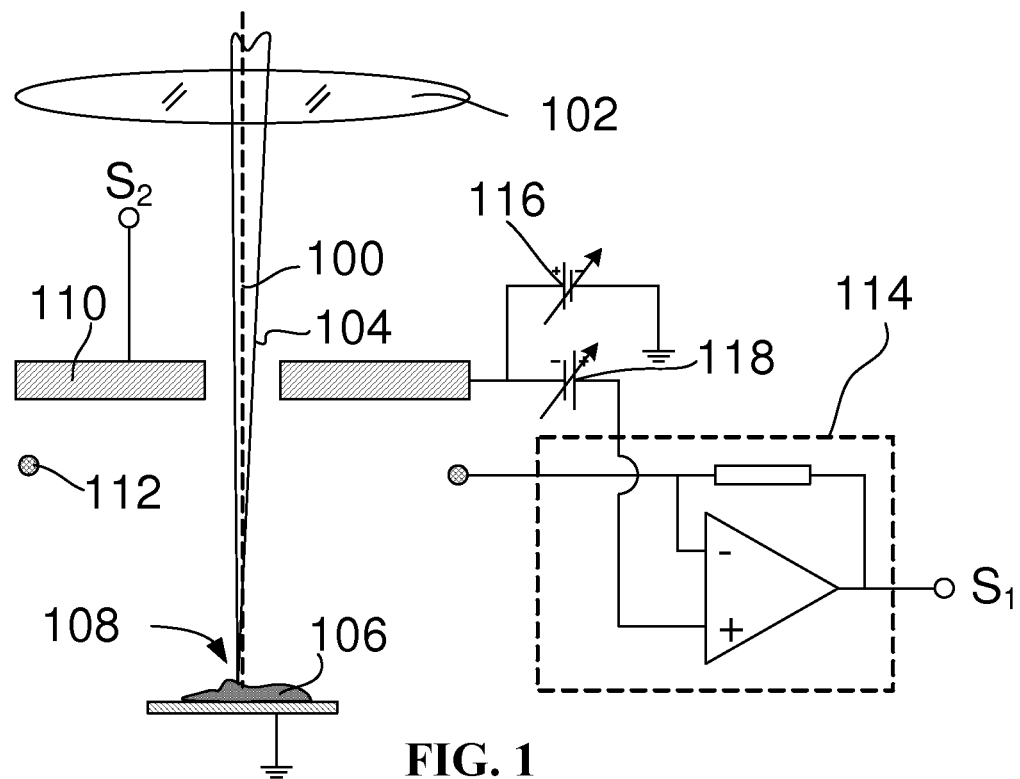
FIG. 1 schematically shows a post-column detector for use in a SEM or an ESEM.

The SED is connected to a current/voltage converter 114, and the output of this converter is available as a signal $S_1$, the signal approximately proportional to the number of electrons impinging on the conversion plate 110. Another signal $S_2$ is available from the conversion plate/radiation detector itself, in which the (average) signal is dependent on the number and the energy of the impinging particles. Voltage source 116 is used to bias the conversion plate with respect to the sample (so as to attract the charged particles to be detected) and voltage source 118 is used to bias the SED with respect to the conversion plate/radiation detector (so as to attract the SE3's).

When using the detector in an ESEM the gas pressure between sample 106 and conversion plate 110 and/or between the conversion plate 110 and the SED 112 is between $10^{-2}$ mbar and 50 mbar, more specifically between 1 and 10 mbar. A voltage difference of several hundreds of volts is applied between sample and conversion plate, as a result of which collisions between gas and SE's take place, resulting in a cascade of electrons reaching the conversion plate. In this way an amplification of the SE signal is attained. Although all SE's arrive at the conversion electrode with approximately the same low energy, for example X-rays simultaneously emerging from the sample are not hindered by the gas and can be detected by the conversion plate/radiation detector. In this way two types of radiation can be detected.

The beam of charged particles 104 is often a beam of energetic electrons, typically with an energy of between 200 eV and 40 keV, although lower and higher electron energies are used. Also a beam of ions, for example gallium or helium, can be used. The objective lens 102 is, in the case of an electron beam, often a magnetic lens. For ions, which due to their higher mass are less susceptible to magnetic fields than electrons, in most cases an electrostatic lens is used. The invention will now be elucidated for an electron beam, but the skilled person will recognize the changes needed for a focused ion beam implementation.

The electron beam is focused on the sample into a spot of typically less than 5 nm, more specifically between 0.8 and 1.2 nm, and the spot is rastered (scanned) over the surface of the sample. In response to the impinging charged particle beam, location dependent radiation emerges from the sample, among which secondary electrons (having an energy of less than 50 eV), backscattered electrons (with an energy of more than 50 eV), X-rays, and, in the case of impinging ions, secondary ions.

Radiation detector 110 can be a semiconductor device as described in Šakić [2], a PIN photodiode, a Silicon Drift Detector (SDD), or any other type of semiconductor device in which the amount of electron/hole pairs is detected. To enhance the amount of SE3 electrons emerging from the radiation detector/conversion plate, it is best coated with a layer of, for example, platinum. As can be derived from Lin [1] platinum shows a high yield for impinging electrons with an energy of, for example 20 keV. The layer should be sufficiently thick to attain these bulk values, or a value close to it, but thin enough for electrons to enter the active volume of the semiconductor. A layer thickness of between 5 nm and 25 nm, more specifically between 10 nm and 20 nm, seems a good compromise.

It is noted that the performance of the radiation detector 110 as a low energy electron detector will be negatively influenced by the platinum layer, but that it enhances the other signal.

It is noted that other semiconductor devices are known that do not measure the energy of impinging electrons, but only the number of impinging electrons. An example is a Geiger-mode avalanche diodes. Although these can be used to detect charged particles, they are not suited to detect the energy of the impinging particles.

Scintillator versions of a radiation detector are also well-known, see e.g. U.S. Pat. No. 4,217,495, commercially available as the Robinson detector. The photon detector used in a scintillator detector can be a photo-multiplier tube, but recently more compact and cheaper devices such as the multi-pixel photon counter are used. The scintillator detector can be used to estimate the energy of the impinging particle because low energy electrons generate less photons than high energy electrons.

Another use of the detector is when the conversion plate is a Silicon Drift Diode (SDD). A SDD is, as known to the person skilled in the art, capable to measure the energy of X-ray quanta emerging from the sample. However, SE's and BSE's should not be allowed to hit the SDD as this influences the working of the SDD as X-ray detector, often even 'blinding' the SDD. By biasing the conversion plate to a voltage such that the BSE's are retarded and hit the conversion plate with an energy of, for example, less than 1 keV, and coating the SDD with a thin layer of, for example, aluminium—showing a high SE yield at low energies—the detector detects X-rays and BSE's simultaneously. It is noted that, although aluminium is especially suited for low energies, also platinum, which is preferred for higher energies, is well suited at low energies, and is better resistant to, for example, oxidation.

Figure 2:
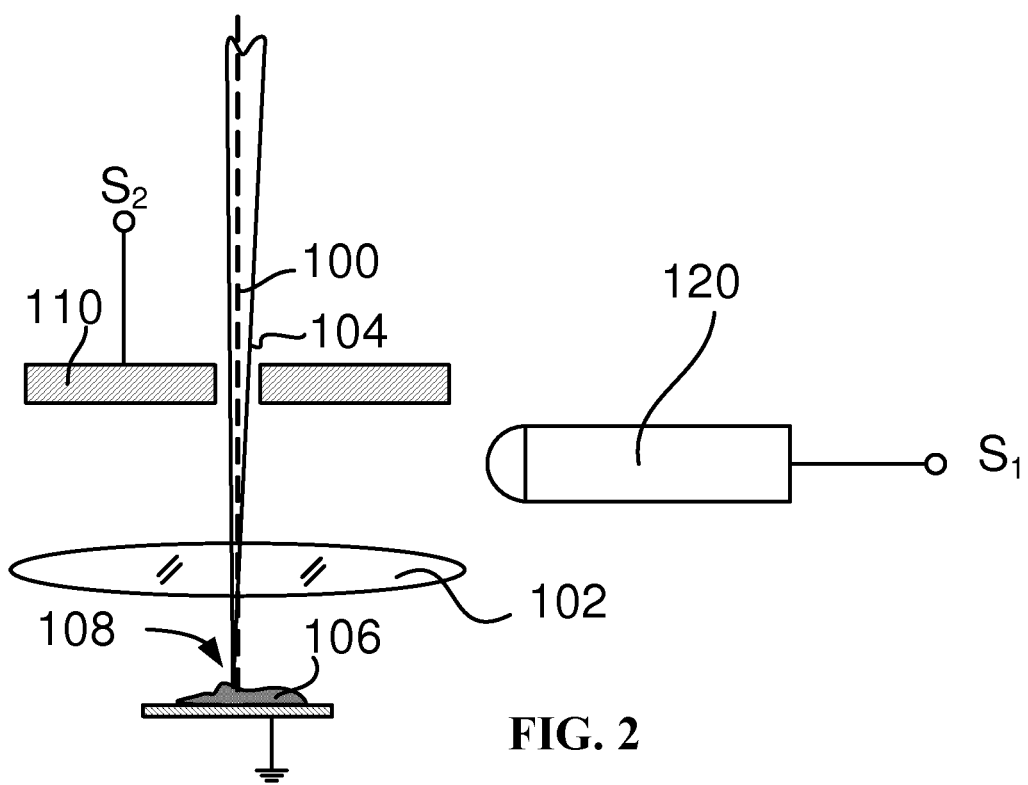
FIG. 2 schematically shows an in-column detector for use in a SEM.

FIG. 2 schematically shows an in-column detector for use in a SEM,

FIG. 2 shows the lower part of a SEM in which a detector is housed. FIG. 2 shows lens 102, that is now closer to the sample than the conversion plate 110. It is noted that the lens may be a so-called gap lens, in which the focusing magnetic field is completely enclosed in the lens, but may also be a so-called immersion lens, in which the sample is immersed in the focusing magnetic field of the lens. The SED is now formed as an Everhart-Thornley detector 120, but any type of SE detector may be used. Characteristic of such a detector is that a field perpendicular to the optical axis 100 occurs to guide the SE's to the SED. This may introduce aberrations in the primary beam 104. As known to the skilled person this may be countered by using an ExB field.

Figure 3:
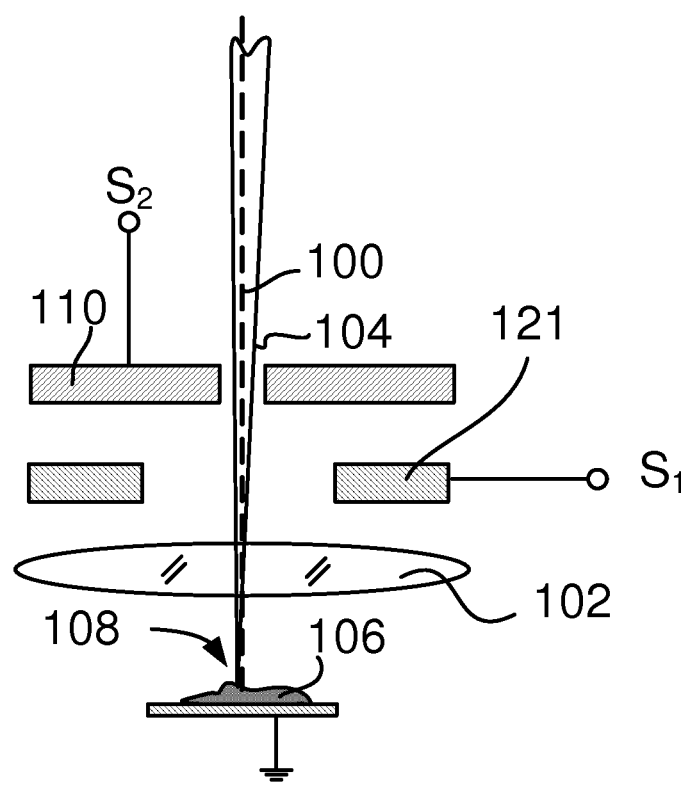
FIG. 3 schematically shows an alternative in-column detector for use in a SEM.

FIG. 3 schematically shows a symmetric in-column detector for use in a SEM,

FIG. 3 is almost identical to FIG. 3, but the conversion plate/radiation detector now shows symmetry around the optical axis: SED 121 is, for example, a symmetric diode with large bore, the bore passing both the primary beam 104 and the radiation emerging from the sample 106. With proper biasing (not shown) the SE3's are guided to the SED121 and detected. As a result of the symmetric form the disadvantage of the detector according to FIG. 2, the aberrations that may be introduced by the asymmetric field, is avoided.

Literature:

[1]: "A new examination of secondary electron yield data", Y. Lin et al., Surf. Interface Anal. 2005; 37: 895-900.

[2]: "Versatile silicon photodiode detector technology for scanning electron microscopy with high-efficiency sub-5 keV electron detection". A.Šakić et al., Technical Digest International Electron Devices Meeting IEDM (2010), Pages: 31.4.1-31.4.4.

We claim as follows:

1. Charged particle detector system for a charged particle apparatus, the system comprising:
    conversion plate generating one or more secondary electrons when exposed to radiation, and
    secondary electron detector for detecting said secondary electrons, wherein the conversion plate is a radiation detector configured to give information about the amount of the radiation and the mean energy of the radiation, as a result of which both the information of the conversion plate and the secondary electron detector are detected simultaneously and combined to provide information about the amount and the mean energy of the radiation.

2. The detector system of claim 1 in which the conversion plate is a semiconductor detector in which electron/hole pairs generated by an impinging radiation are detected, or a scintillator coupled to a photon detector.

3. The detector system of claim 1 in which the conversion plate converts charged particles.

4. The detector system of claim 3 in which the conversion plate is equipped to be biased with respect to a sample at a sample position, the biasing selected such that the detector detects
only positively charged particles,
only negatively charged particles,
negatively charged particles with an energy above a selected threshold value and positively charged particles, or
positively charged particles with an energy above a selected threshold value and negatively charged particles.

5. The detector system of claim 1 in which the conversion plate is coated with a layer comprising platinum, hafnium, tantalum, gold, or chromium, the layer having a thickness of between 5 and 25 nm.

6. A charged particle apparatus equipped with a detector system according to claim 1, in which the charged particle apparatus is equipped with a scanning electron microscope column, a scanning transmission electron microscope column, and/or a focused ion beam column.

7. The charged particle apparatus of claim 6 in which the charged particle apparatus shows a charged particle source and an objective lens with an optical axis, and the conversion plate is positioned between the objective lens and the charged particle source.

8. The charged particle apparatus of claim 6 in which the charged particle apparatus includes a sample position and an objective lens with an optical axis, and the conversion plate is positioned between the objective lens and the sample position.

9. The charged particle apparatus of claim 8 in which the charged particle apparatus is an environmental scanning electron microscope equipped to operate to work with a pressure at the sample position of between $10^{-2}$ mbar and 50 mbar, more specifically between 1 mbar and 10 mbar, said pressure resulting in a gaseous environment between the conversion plate and the detector for detecting said secondary electrons, and the conversion plate is equipped to be biased with respect to the detector for detecting said secondary electrons such that electron multiplication occurs in the gaseous environment.

10. The charged particle apparatus of claim 1 in which the conversion plate is aligned round the optical axis.

11. The detector system of claim 1 in which the secondary electron detector is a wire loop or a flat electrode.

12. A charged particle beam system, comprising:
a source of charged particles;
an objective lens for focusing the charged particles onto the sample; and
a detector system in accordance with claim 1.

13. A charged particle detector system for a charged particle apparatus, the system comprising:
a conversion plate generating one or more secondary electrons when exposed to radiation, and
a secondary electron detector comprising a ring electrode or flat electrode for detecting said secondary electrons,
wherein the conversion plate is a radiation detector providing information about the energy and the quantity of the radiation, as a result of which both the information of the conversion plate and the secondary electron detector are detected simultaneously.

14. The charged particle detector system of claim 13 in which:
the conversion plate includes an aperture for passing the charged particle beam; and
the secondary electron detector is coaxial with the conversion plate.

15. The charged particle detector system of claim 13 in which the secondary electron detector comprises a wire or plate electrode.

16. The charged particle detector system of claim 13 in which the conversion plate comprises a semiconductor detector.

17. The charged particle detector system of claim 13 in which the conversion plate is coated with a layer comprising platinum, hafnium, tantalum, gold, or chromium, the layer having a thickness of between 5 and 25 nm.

18. The detector system of claim 13 in which the conversion plate or the secondary electron detector comprises a scintillator/photomultiplier detector.

19. The detector system of claim 13 in which the conversion plate is equipped to be biased with respect to a sample at a sample position, the biasing selected such that the detector detects
only positively charged particles,
only negatively charged particles,
negatively charged particles with an energy above a selected threshold value and positively charged particles, or
positively charged particles with an energy above a selected threshold value and negatively charged particles.

20. A method of providing information about a sample, comprising:
directing a charged particle beam through an objective lens;
accelerating secondary charged particles emitted from the sample in response to the charged particle beam toward a conversion plate;
detecting the charged particles at the conversion plate;
converting the charged particles to secondary electrons at the conversion plate; and
detecting the secondary electrons using a secondary electron detector, the secondary electron detector producing a signal determined by the number of secondary electrons impinging on the detector, wherein the conversion plate is a radiation detector providing information of the energy and the number of the impinging radiation, as a result of which both the information of the conversion plate and the secondary electron detector are detected simultaneously,
determining from the mean energy of the particles impinging on the converter plate and from the number of secondary election detected by the secondary electron detector, the ratio of secondary electrons to back scattered electrons impinging on the converter plate.

21. The method of claim 20 in which detecting the secondary electrons using a secondary electron detector includes detecting the secondary electrons using a secondary electron detector that is coaxial with the conversion plate.

22. The method of claim 20 further comprising biasing the conversion plate so that the secondary electron detector detects:
only positively charged particles,
only negatively charged particles,
negatively charged particles with an energy above a selected threshold value and positively charged particles, or
positively charged particles with an energy above a selected threshold value and negatively charged particles.

23. The charged particle detector system of claim 1 in which the conversion plate produces a signal determined by the number and mean energy of electrons impinging on the conversion plate to determine the ratio of secondary electrons and backscattered electrons impinging on the conversion plate.

* * * * *